United States Patent
Unrau et al.

(10) Patent No.: US 12,272,669 B2
(45) Date of Patent: Apr. 8, 2025

(54) ARRANGEMENT FOR FORMING A CONNECTION

(71) Applicant: Infineon Technologies AG, Neubiberg (DE)

(72) Inventors: Arthur Unrau, Geseke (DE); Szabolcs Barna, Budapest (HU); Tobias Buehner, Warstein (DE); Norbert Kanvasi, Cegléd (HU)

(73) Assignee: Infineon Technologies AG, Neubiberg (DE)

( * ) Notice: Subject to any disclaimer, the term of this patent is extended or adjusted under 35 U.S.C. 154(b) by 84 days.

(21) Appl. No.: 17/582,832

(22) Filed: Jan. 24, 2022

(65) Prior Publication Data
US 2022/0238478 A1 Jul. 28, 2022

(30) Foreign Application Priority Data
Jan. 25, 2021 (EP) .................................. 21153174

(51) Int. Cl.
*B23K 1/00* (2006.01)
*B23K 3/08* (2006.01)
(Continued)

(52) U.S. Cl.
CPC ............ *H01L 24/75* (2013.01); *B23K 1/0016* (2013.01); *B23K 3/085* (2013.01);
(Continued)

(58) Field of Classification Search
CPC .......... H01L 24/75; H01L 2224/75251; H01L 2224/755; H01L 24/83; H01L 2224/29023; H01L 2224/32225; H01L 2224/751; H01L 2224/75272; H01L 2224/83048; H01L 2224/83192; H01L 2224/8321;
(Continued)

(56) References Cited

U.S. PATENT DOCUMENTS 3,213,825 A * 10/1965 Cooper ................. C23C 14/564
118/724
3,595,205 A * 7/1971 Surprenant ............ D21H 23/42
118/423
(Continued)

FOREIGN PATENT DOCUMENTS

CH 616100 A5 * 3/1980
CN 1668409 A * 9/2005 ............. B23K 1/015
(Continued)

*Primary Examiner* — Kiley S Stoner
(74) *Attorney, Agent, or Firm* — Murphy, Bilak & Homiller, PLLC

(57) ABSTRACT

An arrangement includes a chamber, a heating element arranged in the chamber, wherein the heating element, when a first connection partner with a pre-connection layer formed thereon is arranged in the chamber, is configured to heat the first connection partner and the pre-connection layer, thereby melting the pre-connection layer, and a cooling trap. During the process of heating the first connection partner with the pre-connection layer formed thereon, the cooling trap has a temperature that is lower than the temperature of all other components of or in the chamber such that liquid evaporating from the pre-connection layer is attracted by and condenses on the cooling trap.

20 Claims, 3 Drawing Sheets

(51) Int. Cl.
*H01L 23/00* (2006.01)
*B23K 101/40* (2006.01)
(52) U.S. Cl.
CPC ............... *B23K 2101/40* (2018.08); *H01L 2224/75251* (2013.01); *H01L 2224/755* (2013.01)
(58) Field of Classification Search
CPC ........... H01L 2224/83815; H01L 2224/75101; B23K 2101/36–42; B23K 1/00–206; B23K 3/00–087; B23K 37/04–0461
USPC .... 228/179.1–180.22, 214–224, 234.2, 47.1, 228/49.1, 49.4, 49.5
See application file for complete search history.

(56) References Cited

U.S. PATENT DOCUMENTS

| | | | | |
|---|---|---|---|---|
| 3,904,102 | A * | 9/1975 | Chu | B23K 1/085 134/107 |
| 3,947,240 | A * | 3/1976 | Pfahl, Jr. | B23K 35/386 165/104.19 |
| 4,055,217 | A * | 10/1977 | Chu | B23K 1/015 228/180.1 |
| 4,183,975 | A * | 1/1980 | Sidders | C23C 14/20 427/404 |
| 4,194,297 | A * | 3/1980 | Pfahl, Jr. | B23K 1/015 432/66 |
| 4,256,512 | A * | 3/1981 | Ammann | H05K 3/3494 134/107 |
| 4,615,768 | A * | 10/1986 | McCord | C23G 5/04 203/DIG. 16 |
| 4,735,001 | A * | 4/1988 | Mishina | B23K 1/015 118/729 |
| 4,755,261 | A * | 7/1988 | McCord | B01D 3/007 202/175 |
| 4,757,780 | A * | 7/1988 | Spigarelli | B23K 1/085 118/69 |
| 4,766,677 | A * | 8/1988 | Brooks | B23K 1/015 34/242 |
| 4,776,105 | A * | 10/1988 | Mishina | B23K 1/015 34/242 |
| 4,874,918 | A * | 10/1989 | Okubo | B23K 1/008 219/615 |
| 4,996,781 | A * | 3/1991 | Mishina | B23K 1/012 34/74 |
| 5,156,325 | A * | 10/1992 | Mishina | B23K 1/015 228/234.1 |
| 5,333,774 | A * | 8/1994 | Mishina | B23K 1/015 228/222 |
| 5,514,414 | A * | 5/1996 | Gao | H05K 3/3489 118/724 |
| 5,611,476 | A * | 3/1997 | Soderlund | B01D 53/002 228/43 |
| 5,633,043 | A * | 5/1997 | Hiraga | B05D 3/0493 427/385.5 |
| 5,641,341 | A * | 6/1997 | Heller | B23K 1/203 165/95 |
| 5,913,589 | A * | 6/1999 | Dow | B23K 3/082 34/379 |
| 6,382,500 | B1 | 5/2002 | Master et al. | |
| 9,198,300 | B2 * | 11/2015 | Dautenhahn | B23K 1/085 |
| 2003/0136020 | A1 * | 7/2003 | Miller, Jr. | B23K 1/008 34/429 |
| 2005/0173497 | A1 * | 8/2005 | Dokkedahl | B23K 1/015 228/180.1 |
| 2008/0295686 | A1 * | 12/2008 | Neiderman | B23K 1/018 228/18 |
| 2009/0266088 | A1 * | 10/2009 | Oikawa | B01D 8/00 62/55.5 |
| 2011/0272451 | A1 * | 11/2011 | Neiderman | B23K 1/008 228/19 |
| 2011/0275024 | A1 * | 11/2011 | Katsumata | C21D 1/667 432/4 |
| 2014/0071626 | A1 * | 3/2014 | Campbell | B23P 15/26 165/165 |
| 2014/0186551 | A1 * | 7/2014 | Dang | B23K 3/0607 427/250 |
| 2016/0203940 | A1 * | 7/2016 | Mizuo | H01J 37/20 62/48.1 |
| 2019/0134553 | A1 * | 5/2019 | Richter | B01D 45/08 |
| 2020/0399782 | A1 * | 12/2020 | Najafi-Yazdi | C23C 14/505 |
| 2021/0197304 | A1 * | 7/2021 | Wang | B23K 1/008 |

FOREIGN PATENT DOCUMENTS

| | | | | |
|---|---|---|---|---|
| CN | 202381299 | U * | 8/2012 | |
| CN | 106024563 | A * | 10/2016 | ............. H01J 37/18 |
| CN | 107241871 | A * | 10/2017 | .......... B23K 1/0016 |
| CN | 108097699 | A * | 6/2018 | |
| CN | 108213630 | A * | 6/2018 | ............. B23K 1/008 |
| CN | 210982353 | U * | 7/2020 | |
| CN | 211435156 | U * | 9/2020 | |
| CN | 211668282 | U * | 10/2020 | |
| CN | 213142171 | U * | 5/2021 | |
| CN | 113714583 | A * | 11/2021 | |
| DE | 4024181 | C * | 2/1992 | ............. B23K 1/015 |
| DE | 4024181 | C1 * | 2/1992 | |
| DE | 19749187 | A1 * | 5/1999 | ............. B23K 1/085 |
| DE | 10301102 | B3 * | 3/2004 | ........... B01D 5/0036 |
| DE | 10392557 | T5 * | 5/2005 | ............... B23K 3/08 |
| DE | 102004031713 | B3 * | 12/2005 | ........... B01D 5/0021 |
| DE | 102005058739 | A1 * | 6/2007 | .......... B23K 1/0016 |
| DE | 102006032051 | A1 * | 1/2008 | .......... B23K 3/0653 |
| DE | 202017101405 | U1 * | 7/2017 | |
| EP | 0145969 | A2 * | 6/1985 | |
| EP | 152875 | A * | 8/1985 | ............... B01D 1/00 |
| EP | 0152875 | A2 * | 8/1985 | |
| EP | 153631 | A * | 9/1985 | ............... B01D 1/00 |
| EP | 0153631 | A2 * | 9/1985 | |
| EP | 0205309 | A1 * | 12/1986 | |
| EP | 0965408 | A2 * | 12/1999 | |
| EP | 0999007 | A1 * | 5/2000 | |
| EP | 2604373 | A1 * | 6/2013 | ........... B01D 53/002 |
| EP | 3045253 | A1 * | 7/2016 | |
| EP | 3778088 | A1 * | 2/2021 | ............. B04B 1/08 |
| FI | 121739 | B * | 3/2011 | |
| FR | 2481431 | A1 * | 10/1981 | |
| FR | 2753921 | A1 | 4/1998 | |
| JP | 61232061 | A * | 10/1986 | ............. B23K 1/015 |
| JP | 62252668 | A * | 11/1987 | ............. B23K 1/015 |
| JP | 62270274 | A * | 11/1987 | ............. B23K 1/015 |
| JP | 63313663 | A * | 12/1988 | ............. B23K 1/015 |
| JP | 01087060 | A * | 3/1989 | ............. B23K 1/015 |
| JP | 01150465 | A * | 6/1989 | ............. B23K 1/015 |
| JP | 05050285 | A * | 3/1993 | |
| JP | 2001520462 | A * | 10/2001 | |
| JP | 2009215622 | A * | 9/2009 | |
| JP | 2010212274 | A * | 9/2010 | ............. H01L 24/75 |
| JP | 6677844 | B1 * | 4/2020 | ............. B23K 1/008 |
| KR | 2002005209 | A * | 1/2002 | |
| KR | 102064200 | B1 * | 1/2020 | |
| WO | WO-03106093 | A2 * | 12/2003 | ............. B23K 1/015 |
| WO | WO-2006094621 | A1 * | 9/2006 | ........... B01D 47/021 |
| WO | WO-2007137547 | A1 * | 12/2007 | ............. B23K 1/008 |
| WO | WO-2008006700 | A1 * | 1/2008 | ........... B23K 3/0653 |
| WO | WO-2010066002 | A1 * | 6/2010 | ............. B23K 1/008 |
| WO | WO-2016104710 | A1 * | 6/2016 | ............. B23K 1/002 |
| WO | WO-2021229073 | A1 * | 11/2021 | |

* cited by examiner

ARRANGEMENT FOR FORMING A CONNECTION

RELATED APPLICATIONS

The instant application claims priority to EPO patent application number EP 21153174.4 filed on Jan. 25, 2021, the content of which is incorporated by reference herein in its entirety.

TECHNICAL FIELD

The instant disclosure relates to an arrangement for forming a connection, in particular for forming a solder connection.

BACKGROUND

Power semiconductor module arrangements often include a plurality of different components such as a substrate, semiconductor bodies mounted on the substrate, a housing, terminal elements connected to the substrate and configured to provide an electrical connection between the inside and the outside of the housing, bonding wires, and many more. Many of these components are mechanically and electrically coupled to at least one other component. Therefore, a plurality of connections is formed between different components of the power semiconductor module arrangement. For example, the semiconductor bodies are usually electrically and mechanically connected to the substrate by an electrically conductive connection layer. Such an electrically conductive connection layer can generally be a solder layer, a layer of an electrically conductive adhesive, or a layer of a sintered metal powder, e.g., a sintered silver (Ag) powder, for example.

Such a connection layer between two different components can be formed in a special chamber, for example. One of the connection partners can be arranged in the chamber, with a pre-connection layer formed on this first connection partner. Before a second connection partner is arranged on the first connection partner, with the pre-connection layer arranged therebetween, the pre-connection layer can be melted to a certain extent. For example, the first connection partner with the pre-connection layer formed thereon can be inserted into the chamber and be heated in order to melt the pre-connection layer. When heating the pre-connection layer, liquid which is present in the pre-connection layer may evaporate. This evaporated liquid generally condenses on the walls and ceiling of the chamber. When a certain number of heating cycles has been performed successively in one and the same chamber, a large amount of liquid is usually collected on the walls and the ceiling of the chamber. If the amount of liquid reaches a certain threshold amount, there is a risk of formation of droplets which subsequently drop down from the ceiling of the chamber and onto a first connection partner that is presently arranged in the chamber and the pre-connection layer formed thereon. Such contaminations may adversely affect the strength of the connection layer subsequently formed between the first connection partner and the second connection partner and result in failures of the finished power semiconductor module arrangement.

There is a need for an arrangement that reduces, or better even avoids, the aforementioned and other drawbacks and which allows producing connections between connection partners with increased performance and reliability.

SUMMARY

An arrangement includes a chamber, a heating element arranged in the chamber, wherein the heating element, when a first connection partner with a pre-connection layer formed thereon is arranged in the chamber, is configured to heat the first connection partner and the pre-connection layer, thereby melting the pre-connection layer, and a cooling trap. During the process of heating the first connection partner with the pre-connection layer formed thereon, the cooling trap has a temperature that is lower than the temperature of all other components of or in the chamber such that liquid evaporating from the pre-connection layer is attracted by and condenses on the cooling trap.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples of how the invention can be implemented. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead such designations serve solely to denote different "elements". That is, e.g., the existence of a "third element" does not necessarily require the existence of a "first element" or a "second element". A semiconductor body as described herein may be made of (doped) semiconductor material and may be a semiconductor chip or be included in a semiconductor chip. A semiconductor body has electrically connectable pads and includes at least one semiconductor element with electrodes.

Figure 1:
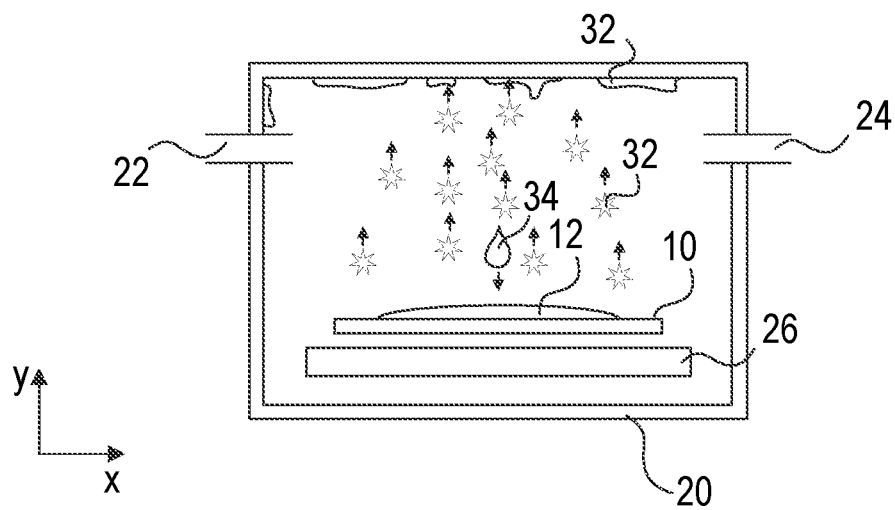
FIG. 1 is a cross-sectional view of an arrangement for heating a pre-connection layer.

Referring to FIG. 1, a cross-sectional view of an arrangement for forming a pre-connection layer is schematically illustrated. The arrangement includes a chamber 20. The chamber 20 comprises an inlet 22, an outlet 24, and a heating element 26. The heating element 26 in this arrangement comprises a heating plate. This, however, is only an example. The heating element 26 can be implemented in any suitable way. A gas such as nitrogen ($N_2$), for example, is introduced into the chamber 20 through the inlet 22. The outlet 24 is used to generate a vacuum within the chamber 20. A first connection partner 10 can be arranged in the chamber 20, e.g., on the heating element 26, with a pre-connection layer 12 formed on the first connection partner 10. The first connection partner 10 can be a semiconductor substrate such as, e.g., a Direct Copper Bonding (DCB) substrate, a Direct Aluminum Bonding (DAB) substrate, an Active Metal Brazing (AMB) substrate, an Insulated Metal Substrate (IMS), or a conventional printed circuit board (PCB). According to another example, the first connection partner 10 can be a baseplate such as, e.g., a Cu or AlSiC baseplate. A baseplate can also include or consist of any other suitable material. These, however, are only examples. The first connection partner 10 can be any connection partner that is to be mechanically and electrically coupled to a second connection partner (second connection partner not explicitly illustrated in the figures). The pre-connection layer 12 can be a solder layer, a layer of an electrically conductive adhesive, or a layer of a sintered metal powder, e.g., a sintered silver (Ag) powder, for example. The second connection partner can be a semiconductor body such as a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element, for example. According to another example, the second connection partner can be a substrate such as, e.g., a DCB, DAB, AMB, IMS, PCB. The second connection partner can also be any other suitable substrate. These, however, are only examples. The second connection partner can be any connection partner that is to be mechanically and electrically coupled to the first connection partner 10. It is also possible that the first and second connection partners are not associated with power semiconductor modules at all.

According to one example, the pre-connection layer 12 is formed on the first connection partner 10 before the first connection partner 10 enters the chamber 20. The pre-connection layer 12 at that time contains a certain amount of liquid and/or solid, depending on the physical behavior of the material at room temperature and on atmosphere pressure. The pre-connection layer 12 is heated before arranging a second connection partner on the first connection partner 10, with the pre-connection layer 12 arranged therebetween, in order to melt the pre-connection layer 12 to a certain extent. The heating element 26 is configured to generate heat, thereby heating the first connection partner 10 and the pre-connection layer 12 formed thereon. When heated, a certain amount of liquid 32 may evaporate from the pre-connection layer 12. This evaporated liquid 32 may condense on the walls and/or the ceiling of the chamber 20, for example. When a certain number of heating cycles has been performed successively in one and the same chamber 20 (a plurality of different first connection partners 10 with pre-connection layers 12 formed thereon are successively heated), a large amount of liquid 32 may collect on the walls and/or the ceiling of the chamber 20. If the amount of liquid reaches a certain point, there is a risk of droplets 34 forming which subsequently may drop down, e.g., from the ceiling of the chamber and onto a first connection partner 10 that is presently arranged in the chamber 20 as well as on the pre-connection layer 12 formed thereon. Such contaminations may adversely affect the strength of a resulting connection layer subsequently formed between the first connection partner 10 and a second connection partner and result in failure of the finished power semiconductor module arrangement.

Generally, once the heating process in the chamber 20 is completed, the first connection partner 10 can be removed from the chamber 20, and a second connection partner can be arranged on the first connection partner 10 with the melted pre-connection layer 12 arranged between the first and the second connection partner. Alternatively, it is also possible that the second connection partner is already arranged on the first connection partner 10 with the melted pre-connection layer 12 arranged between the first and the second connection partner during the heating process. Subsequently, the first connection partner 10 and the second connection partner can be mechanically and electrically connected to each other by pressing the second connection partner onto the pre-connection layer 12. Under the influence of pressure and, optionally, more heat, a connection layer can be formed between the first and the second connection partner which forms a permanent connection between the two connection partners. Subsequently, the connection partners and the finished connection layer can be cooled.

Figure 2:
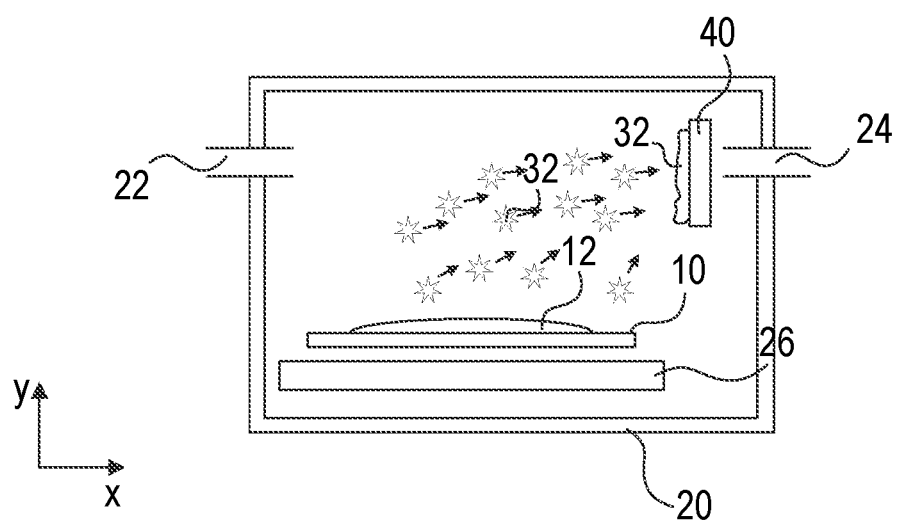
FIG. 2 schematically illustrates a cross-sectional view of an arrangement for heating a pre-connection layer according to one example.

Now referring to FIG. 2, the arrangement according to a first example further comprises a cooling trap 40, which can also be referred to as condensation trap. The cooling trap 40 has a temperature which is lower than the ambient temperature in the chamber 20. The temperature of the cooling trap 40 is also lower than the temperatures of other components of the chamber 20 or arranged in the chamber 20. For example, the temperature of the cooling trap 40 can be lower than the walls and the ceiling of the chamber 20, or lower than the temperature of the heating plate 26. As has been described above, a vacuum is generated in the chamber 20 during the process of heating the pre-connection layer 12. When arranged in a vacuum, a cooling trap 40 condenses vapor into liquid. That is, liquid 32 evaporated from the pre-connection layer 12 is captured by the cooling trap 40 instead of by other components of or arranged in the chamber 20, e.g., the walls and the ceiling of the chamber 20. This is illustrated by means of arrows in FIG. 2. The cooling trap 40 can be arranged in a position in the chamber 20 distant from the first connection partner 10. In the example illustrated in FIG. 2, the cooling trap 40 is arranged in an upright position. That is, the cooling trap 40 provides a vertical surface on which the liquid 32 may condense. When a lot of liquid 32 accumulates on the cooling trap 40, it drops down when a certain threshold amount is exceeded. The cooling trap 40 can be arranged in a position in the chamber 20 that prevents droplets from falling onto the first connection partner 10 or onto the pre-connection layer 12. Droplets falling from the cooling trap 40 can fall past the first connection partner 10 and onto the floor of the chamber 20, for example.

According to another example, droplets falling from the cooling trap 40 are collected in a collection tray 42 arranged below the cooling trap 40. This is exemplarily illustrated in FIG. 3. In this example, it is possible to arrange the cooling trap 40 at least partly above the first connection partner 10, for example, as the collection tray 42 prevents any liquid from falling onto the first connection partner 10 or onto the pre-connection layer 12.

Generally, the cooling trap 40 can have a temperature of between 10 and 40° C., for example. According to one example, the cooling trap 40 has a temperature of about 20° C. On the other hand, the walls, bottom and ceiling of the chamber 20 can be heated to a temperature of between 70 and 100° C., for example. According to one example, the walls, bottom and ceiling of the chamber 20 are heated to a temperature of 90° C. Generally speaking, a temperature difference between the cooling trap 40 and the walls, bottom and ceiling of the chamber 20 can be at least 30° C., at least 50° C., or at least 70° C. In this way it can be ensured that the liquid condenses on the cooling trap 40 instead of on the walls and ceiling of the chamber 20.

The gas that is fed into the chamber 20 can also be heated to temperatures of at least 70° C. According to one example, the gas fed into the chamber 20 has a temperature of 100° C. In this way, the overall ambient temperature in the chamber 20 is significantly higher than the temperature of the cooling trap 40. The cooling trap 40, therefore, is always the coldest element in the chamber 20 and liquid will condense mainly, if not exclusively, on the surface of the cooling trap 40. By heating the gas that is fed into the chamber 20, condensation of the evaporated liquid in its gaseous phase can be prevented before it reaches the cooling trap 40. Heating the gas, however, is only optional. It is also possible to introduce gas into the chamber 20 which has a temperature of below 70° C., such as 20° C., for example.

In the examples illustrated in the Figures, the inlet 22 is arranged in a position above the heating element 26 in a vertical direction y. This, however, is only an example. Generally, the inlet 22 can be arranged in any suitable position. According to one example (not specifically illustrated), the inlet 22 is arranged in close proximity to the heating element 26, e.g., vertically below or horizontally beside the heating element 26. In this way, the gas entering the chamber 20 through the inlet 22 always flows past the heating element 26 when entering the chamber 20. Thus, even when the gas has a comparably low temperature when passing through the inlet 22, it is heated by the heating element 26 immediately after entering the chamber 26. Consequently, no additional heating mechanisms are needed for heating the gas and increasing the ambient temperature.

Figure 3:
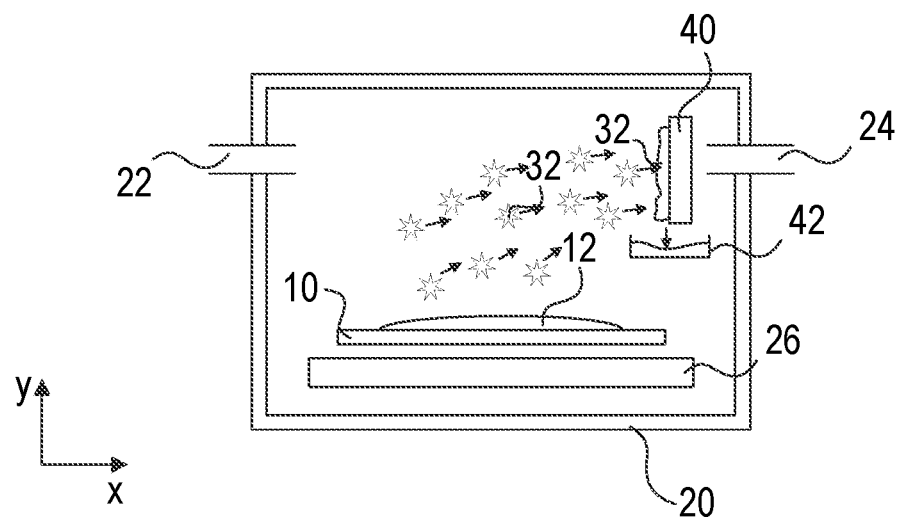
FIG. 3 schematically illustrates a cross-sectional view of an arrangement for heating a pre-connection layer according to another example.

In the examples illustrated in FIGS. 2 and 3, the cooling trap 40 is arranged above the first connection partner 10 in the vertical direction y. This, however, is only an example. It is also possible to arrange the cooling trap 40 anywhere below the first connection partner 10 in the vertical direction y, or beside the first connection partner 10 in a horizontal direction x.

The cooling trap 40 can comprise a cold-resistant material such as glass or metal, for example. The cooling trap 40 can comprise a single plate or a plurality of fins or pins arranged next to each other, for example. Any other suitable form, however, is also possible.

Figure 4:
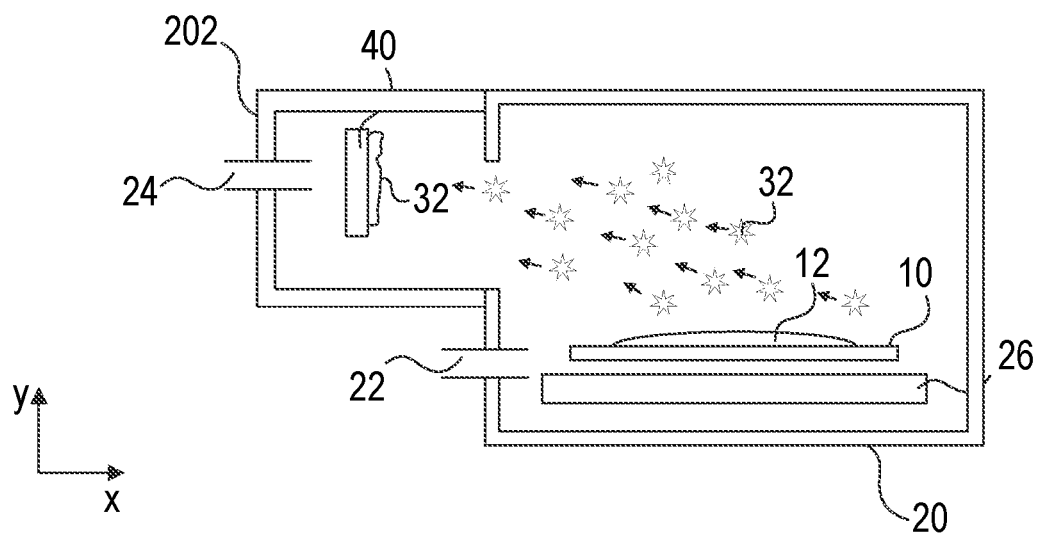
FIG. 4 schematically illustrates a cross-sectional view of an arrangement for heating a pre-connection layer according to another example.

In the examples illustrated in FIGS. 2 and 3, the cooling trap 40 is arranged in the chamber 20. This, however, is only an example. As is schematically illustrated in the example of FIG. 4, the cooling trap 40 can also be arranged in a second chamber 202 arranged adjacent to the chamber 20. The chamber 20 and the second chamber 202 can be coupled to each other through an opening which is large enough to allow the evaporated liquid to reach the cooling trap 40 unhindered. The second chamber 202 can be seen as an extension of the chamber 20. Liquid condensing on the cooling trap 40 can drop down onto the bottom of the second chamber 202, may be collected and subsequently removed from the second chamber 202. As is illustrated in this example, the outlet 24 can be arranged in the second chamber 202 behind the cooling trap 40. "Behind the cooling trap" in this context refers to a position of the outlet 24 such that the cooling trap 40 is arranged between the outlet 24 and the first and second connection partners 10.

Figure 5:
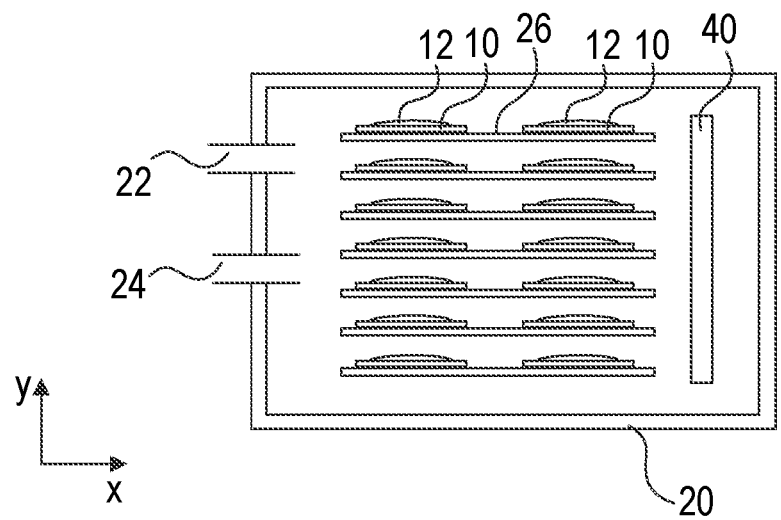
FIG. 5 schematically illustrates a cross-sectional view of an arrangement for heating a pre-connection layer according to an even further example.

In the examples illustrated in FIGS. 2 to 4 and described above, the heating element 26 only comprises a heating plate. According to another example and as is exemplarily illustrated in FIG. 5, the heating element 26 can not only comprise a heating plate but also a cooling plate. That is, the heating element 26 can be a combined heating and cooling element. The arrangement can comprise a plurality of heating elements 26, wherein at least one first connection partner 10 is arranged on each of the plurality of heating elements 26. In this example, the chamber 20 can be or can comprise a one chamber vacuum solder oven. That is, a vacuum can be generated inside the chamber 20 and soldering processes can be performed under vacuum and at high temperatures (e.g., at temperatures of above 400° C., or above 600° C.). Process gasses can be inserted into the chamber 20. After performing a soldering process, the heating elements 26 can subsequently be cooled down in order to cool down the inside of the chamber 20 as well as the connection partners. A cooling trap 40 can be arranged inside the chamber 20 in a way similar to what has been described with respect to FIGS. 2, 3 and 4 above. The cooling trap 40 captures liquid evaporated from the plurality of pre-connection layers 12 arranged inside the chamber 20 such that the liquid does not condense on other components of or arranged in the chamber 20.

Figure 6:
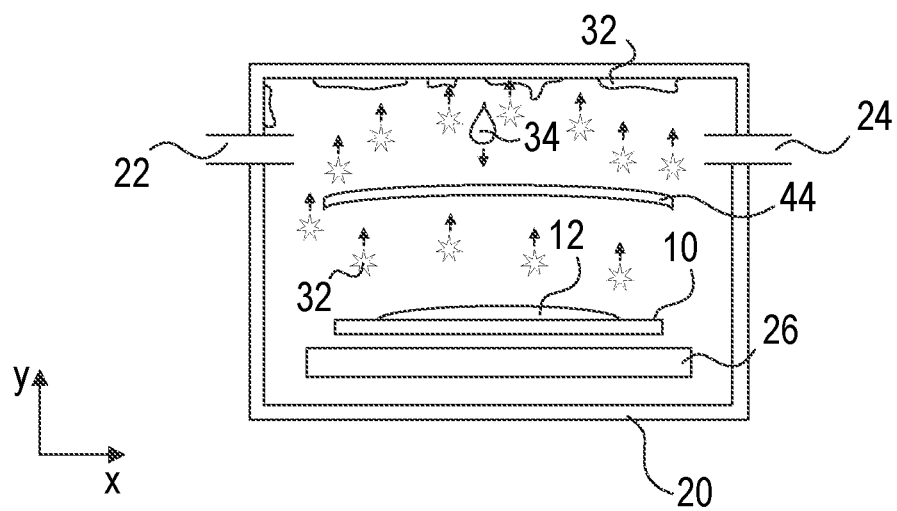
FIG. 6 schematically illustrates a cross-sectional view of an arrangement for heating a pre-connection layer according to an even further example.

According to an even further example, and as is schematically illustrated in FIG. 6, it is also possible that the arrangement comprises a protection device 44. The protection device 44 can comprise a foil or plate, for example. The protection device 44 is arranged between the first connection partner 10 and the ceiling of the chamber 20. The protection device 44 is larger in size than the first connection partner 10 in order to completely cover the first connection partner 10. Even further, the protection device 44 can be deflected such that a central part of the protection device 44 is arranged closer to the ceiling of the chamber 20 than the edges of the protection device 44. The protection device 44 can be heated up to temperatures of above 80° C. According to one example, the protection device 44 has a temperature of about 100° C. The ceiling of the chamber 20, on the other hand, has a temperature that is well below the temperature of the protection device 44. For example, the ceiling of the chamber 20 can have a temperature of about 20° C.-60° C. A temperature difference between the protection device 44 and the ceiling of the chamber 20 can be at least 40° C., for example. In this way, the evaporated liquid 32 condenses on the ceiling of the chamber 20, and not on the protection device 44, as the ceiling acts as a cooling trap which attracts the evaporated liquid.

When a certain amount of liquid has accumulated on the ceiling of the chamber 20 and droplets 34 form which subsequently fall down from the ceiling towards the first connection partner 10, such droplets fall onto the protection device 44 which is arranged between the ceiling and the first connection partner 10. The protection device 44 therefore prevents the accumulated liquid from contaminating the first connection partner 10 and the pre-connection layer 12 formed thereon. Due to the curvature of the protection device 44, the liquid flows towards the edges of the protection device 44. From there it can drip further down past the first connection partner 10 and onto the bottom of the chamber 20.

According to another example (not specifically illustrated), the protection device 44 can be implemented as a collection tray, similar to the collection tray 42 as illustrated in FIG. 3. Such collection tray also completely covers the first connection partner 10 to prevent any droplets 34 from falling onto the first connection partner 10 or the pre-connection layer 12.

The protection device 44 that has been described with respect to FIG. 6 above is arranged distant from the first connection partner 10 in the vertical direction y. That is, the protection device 44 does not contact the first connection partner 10 or the pre-connection layer 12. Further, the protection device 44 is arranged distant from the ceiling and the walls of the chamber 20. In this way, the evaporated liquid 32 can reach the ceiling of the chamber 20, which functions as a cooling trap, unhindered.

The invention claimed is:

1. A method for forming a solder connection, comprising:
providing an arrangement comprising:
a chamber with an outlet that is configured to generate a vacuum within the chamber;
a heating element and a cooling trap arranged in the chamber; and
a collection tray arranged below the cooling trap and configured to collect droplets of liquid falling from the cooling trap;
arranging in the chamber a first connection partner with a pre-connection layer formed thereon;
putting the chamber in a vacuum state; and
with the chamber in the vacuum state, heating the first connection partner with the pre-connection layer formed thereon with the heating element with the chamber being in the vacuum state, thereby melting the pre-connection layer,
wherein during the process of heating the first connection partner with the pre-connection layer formed thereon, the cooling trap has a temperature that is lower than the temperature of all other components of or in the chamber such that liquid evaporating from the pre-connection layer is attracted by and condenses on the cooling trap with the chamber being in the vacuum state.

2. The method of claim 1, wherein the cooling trap is configured to have a temperature of between 1° and 40° C.

3. The method of claim 2, wherein the cooling trap is configured to have a temperature of 20° C.

4. The method of claim 1, wherein the cooling trap comprises a single plate or a plurality of fins or pins arranged next to each other.

5. The method of claim 1, wherein the chamber comprises a bottom, walls and a ceiling, and wherein the bottom, walls and ceiling of the chamber have a temperature of between 70 and 100° C.

6. The method of claim 5, wherein the bottom, walls and ceiling of the chamber have a temperature of 90° C.

7. The method of claim 5, wherein a temperature difference between the cooling trap and the walls, bottom and ceiling of the chamber is at least 30° C.

8. The method of claim 1, wherein the chamber comprises an inlet configured to allow a gas to enter the chamber.

9. The method of claim 8, wherein the arrangement is configured such that the gas entering the chamber through the inlet is heated to a temperature of at least 70° C.

10. The method of claim 9, wherein the arrangement is configured such that the gas entering the chamber through the inlet is heated to a temperature of at least 100° C.

11. The method of claim 9, wherein the inlet is arranged in close proximity to the heating element such that gas entering the chamber through the inlet flows past and is heated by the heating element.

12. The method of claim 1, wherein the cooling trap is formed by a ceiling of the chamber.

13. The method of claim 12, wherein the arrangement further comprises a protection device that, when the first connection partner with the pre-connection layer formed thereon is arranged in the chamber, is arranged between the first connection partner and the ceiling of the chamber, wherein the protection device is configured to prevent any liquid accumulated on the ceiling of the chamber from dripping onto the first connection partner and the pre-connection layer.

14. A method for forming a solder connection, comprising:
providing an arrangement comprising:
a chamber with an outlet that is configured to generate a vacuum within the chamber; and
a heating element and a cooling trap arranged in the chamber, the cooling trap configured to have a temperature of between 1° and 40° C.;
arranging in the chamber a first connection partner with a pre-connection layer formed thereon;
putting the chamber in a vacuum state; and
with the chamber in the vacuum state, heating the first connection partner with the pre-connection layer formed thereon with the heating element, thereby melting the pre-connection layer,
wherein during the process of heating the first connection partner with the pre-connection layer formed thereon, the cooling trap has a temperature that is lower than the temperature of all other components of or in the chamber such that liquid evaporating from the pre-connection layer is attracted by and condenses on the cooling trap with the chamber being in the vacuum state.

15. The method of claim 14, wherein the cooling trap is configured to have a temperature of 20° C.

16. The method of claim 14, wherein the cooling trap comprises a single plate or a plurality of fins or pins arranged next to each other.

17. The method of claim 14, wherein the chamber comprises an inlet configured to allow a gas to enter the chamber.

18. A method for forming a solder connection, comprising:
providing an arrangement comprising:
a chamber with an outlet that is configured to generate a vacuum within the chamber, the chamber comprising a bottom, walls and a ceiling, and wherein the bottom, walls and ceiling of the chamber have a temperature of between 7° and 100° C.; and
a heating element and a cooling trap arranged in the chamber;
arranging in the chamber a first connection partner with a pre-connection layer formed thereon;
putting the chamber in a vacuum state; and
with the chamber in the vacuum state, heating the first connection partner with the pre-connection layer formed thereon with the heating element, thereby melting the pre-connection layer,
wherein during the process of heating the first connection partner with the pre-connection layer formed thereon, the cooling trap has a temperature that is lower than the temperature of all other components of or in the chamber such that liquid evaporating from the pre-connection layer is attracted by and condenses on the cooling trap with the chamber being in the vacuum state.

19. The method of claim 18, wherein the bottom, walls and ceiling of the chamber have a temperature of 90° C.

20. The method of claim 18, wherein a temperature difference between the cooling trap and the walls, bottom and ceiling of the chamber is at least 30° C.

* * * * *

UNITED STATES PATENT AND TRADEMARK OFFICE
CERTIFICATE OF CORRECTION

PATENT NO. : 12,272,669 B2  
APPLICATION NO. : 17/582832  
DATED : April 8, 2025  
INVENTOR(S) : A. Unrau et al.

Page 1 of 1

It is certified that error appears in the above-identified patent and that said Letters Patent is hereby corrected as shown below:

In the Claims

Column 7, Line 39 (Claim 2) please change "1° and" to -- 10 and --

Column 8, Line 18 (Claim 14) please change "1° and" to -- 10 and --

Column 8, Line 48 (Claim 18) please change "7° and" to -- 70 and --

Signed and Sealed this  
Eighth Day of July, 2025

Coke Morgan Stewart  
*Acting Director of the United States Patent and Trademark Office*